(12) United States Patent
Stella et al.

(10) Patent No.: US 10,910,302 B2
(45) Date of Patent: Feb. 2, 2021

(54) POWER SEMICONDUCTOR DEVICE WITH A DOUBLE ISLAND SURFACE MOUNT PACKAGE

(71) Applicant: STMicroelectronics S.r.l., Agrate Brianza (IT)

(72) Inventors: Cristiano Gianluca Stella, San Gregorio di Catania (IT); Agatino Minotti, Mascalucia (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 16/385,928

(22) Filed: Apr. 16, 2019

(65) Prior Publication Data
US 2019/0326208 A1    Oct. 24, 2019

(30) Foreign Application Priority Data
Apr. 23, 2018  (IT) .......................... 102018000004782

(51) Int. Cl.
  *H01L 23/498*    (2006.01)
  *H01L 23/373*    (2006.01)
(52) U.S. Cl.
  CPC .... *H01L 23/49844* (2013.01); *H01L 23/3735* (2013.01); *H01L 23/49822* (2013.01)
(58) Field of Classification Search
  None
  See application file for complete search history.

(56) References Cited

U.S. PATENT DOCUMENTS

2009/0079006 A1\* 3/2009 Tanaka ................... H01L 24/37
                                                                    257/368
2013/0161801 A1\* 6/2013 Otremba ........... H01L 23/49811
                                                                    257/668

FOREIGN PATENT DOCUMENTS

EP        2 804 212 A1   11/2014
WO     2017/157486 A1    9/2017

\* cited by examiner

*Primary Examiner* — Mozzam Hossain
*Assistant Examiner* — Stanetta D Isaac
(74) *Attorney, Agent, or Firm* — Seed IP Law Group LLP (57) ABSTRACT

A power semiconductor device including a first and second die, each including a plurality of conductive contact regions and a passivation region including a number of projecting dielectric regions and a number of windows. Adjacent windows are separated by a corresponding projecting dielectric region with each conductive contact region arranged within a corresponding window. A package of the surface mount type houses the first and second dice. The package includes a first bottom insulation multilayer and a second bottom insulation multilayer carrying, respectively, the first and second dice. A covering metal layer is arranged on top of the first and second dice and includes projecting metal regions extending into the windows to couple electrically with corresponding conductive contact regions. The covering metal layer moreover forms a number of cavities, which are interposed between the projecting metal regions so as to overlie corresponding projecting dielectric regions.

21 Claims, 5 Drawing Sheets

POWER SEMICONDUCTOR DEVICE WITH A DOUBLE ISLAND SURFACE MOUNT PACKAGE

BACKGROUND

Technical Field

The present disclosure relates to a power semiconductor device having a package of the surface mount type and including a pair of islands.

Description of the Related Art

As is known, semiconductor devices are widely used in numerous fields. For instance, in the field of power conversion, semiconductor devices are widely used, which, in operation, are subject to high-voltage or very-high-voltage biasing (i.e., with values of up to 1000-2000 V) and are traversed by currents that may switch rapidly.

There are hence required particular solutions for production of the corresponding packages so as to guarantee the required electrical insulation and an adequate distance of separation between the leads that are connected to the terminals of the device, as well as to ensure an adequate heat dissipation outwards.

In general, it is common to refer to power devices to indicate semiconductor devices capable of withstanding the aforementioned biasing voltages and currents.

Power devices include, for example, the so-called power MOSFETs, each of which is provided in a die of semiconductor material (typically silicon), which has a first main surface (rear surface) that carries a drain contact pad, and a second main surface (front surface), opposite to the first main surface, which carries contact pads, in particular source and gate pads.

The die is fixed to a conductive support referred to as "leadframe", provided with leads for external connection of the terminals of the power MOSFET. In particular, the die is generally fixed to the leadframe by bonding the drain pad to a supporting portion of the leadframe, which also has a function of heat dissipation. Leads are coupled to the gate and source pads by bonding wires or clips. The ensemble consisting of the die and the leadframe is packaged in a mass of resin or other insulating packaging material.

Traditional packages for power MOSFETs are generally arranged vertically and comprise pins, which form corresponding leads and project downwards from a single bottom side of the package structure (which has a generically parallelepipedal shape), for electrical coupling to a printed-circuit board (PCB). An appropriate heat dissipater, typically a metal plate, is coupled to the package structure, which is also arranged vertically with respect to the printed-circuit board.

Power MOSFET devices are widely used, for example, in the field of the so-called switch-mode power supplies (SMPSs) with power-factor correction (PFC) of a bridgeless type. In particular, power MOSFET devices are used for providing so-called bidirectional AC switches, which enable interruption, in an electrically controlled way, of alternating currents. In this connection, typically an AC switch comprises a pair of power MOSFET devices, connected in back-to-back mode, i.e., by connecting together the respective source terminals. Moreover, the two power MOSFET devices that form the AC switch are of the type previously described; hence, they are of a discrete type and each of them has a respective package of a vertical type, with the corresponding vertical pins. Unfortunately, these packages, albeit guaranteeing an optimal dissipation of heat and high levels of electrical insulation, are particularly cumbersome and do not enable integration of the two power MOSFET devices together.

BRIEF SUMMARY

Embodiments of the present disclosure provide a power semiconductor device that will overcome at least in part the drawbacks of the prior art.

According to one embodiment of the present disclosure, a power semiconductor device includes a first die and a second die, each of which comprises a plurality of conductive contact regions and a passivation region, which includes a number of projecting dielectric regions and a number of windows. Adjacent windows are separated by a corresponding projecting dielectric region, each conductive contact region being arranged within a corresponding window. The device includes a package of the surface mount type, housing the first and second dies. The package includes a first bottom insulation multilayer and a second bottom insulation multilayer, which carry, respectively, the first and second dice and each include a respective top metal layer, a respective bottom metal layer and a respective intermediate insulating layer, interposed between the corresponding top metal layer and the corresponding bottom metal layer. A covering metal layer is arranged on top of the first and second dice and comprises projecting metal regions, which extend into the windows so as to couple electrically with corresponding conductive contact regions. The covering metal layer moreover forms a number of cavities, interposed between the projecting metal regions so as to overlie corresponding projecting dielectric regions.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
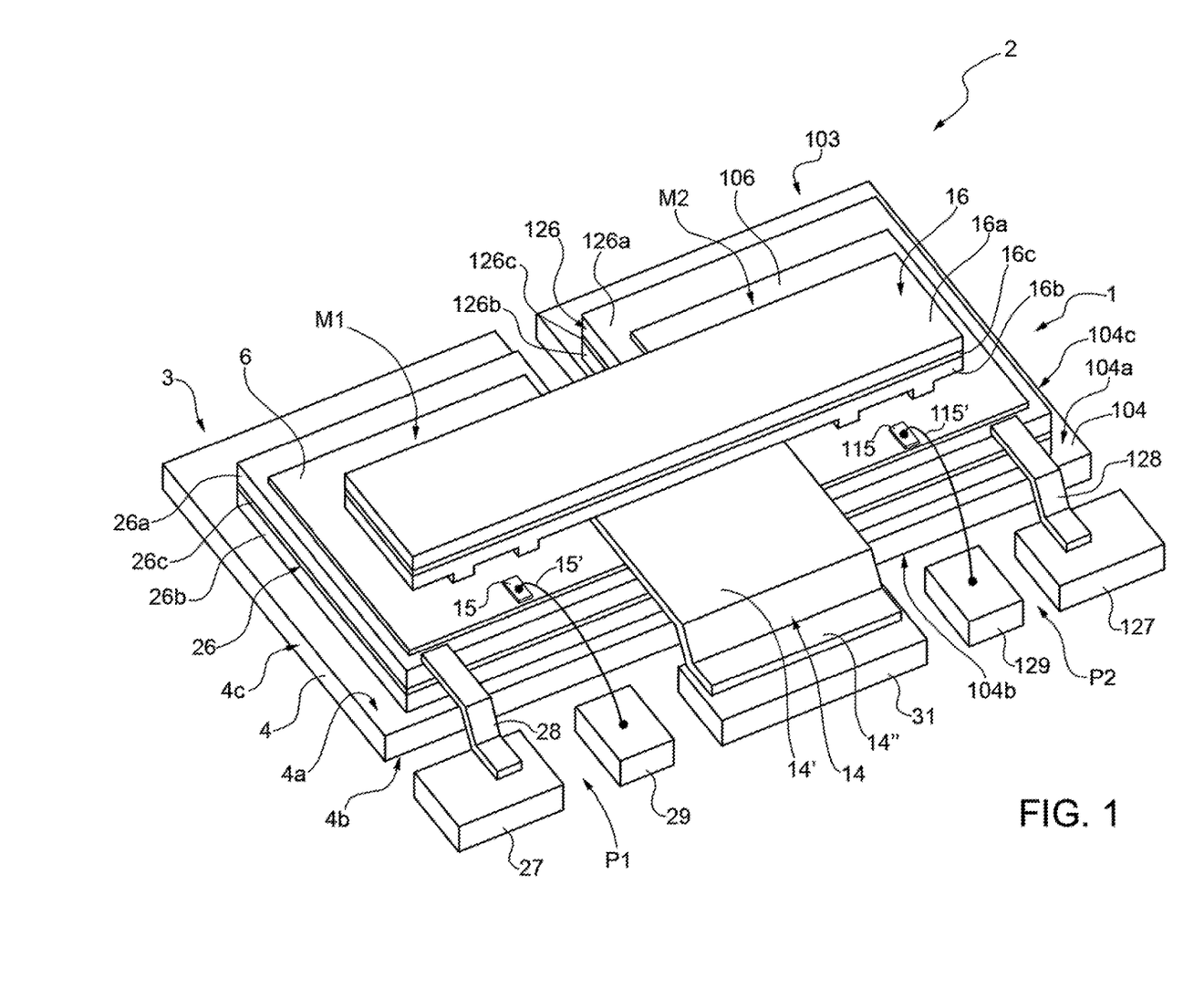
FIG. 1 is a partially simplified schematic perspective view, with portions removed, of an embodiment of the present semiconductor device.

FIG. 1 shows a package 1 for a semiconductor device 2, in particular a bidirectional AC switch. As will be highlighted hereinafter, the package 1 is of the double island surface mount type.

In detail, the package 1 comprises a package coating 5 (illustrated in FIG. 2, but not in FIG. 1), made of insulating material (for example, an epoxy resin), and a first portion P1 and a second portion P2. Without this implying any loss of generality, the first and second portions P1, P2 are the same as one another and are arranged in a symmetrical way within the semiconductor device 2, as on the other hand also are the first and second dice 6, 106. In what follows, for brevity, only the first portion P1 of the package 1 is hence described. Moreover, the components of the second portion P2 are designated by the same reference numbers as the components of the first portion P1, increased by 100.

In detail, the first portion P1 comprises a support 4 of a leadframe 3, formed by a metal plate (for example, made of copper and with a parallelepipedal shape) and having a top surface 4a and a bottom surface 4b. The support 4, in itself known, is also referred to as "island" or "die pad."

The bottom surface 4b of the support 4 forms an exposed bottom surface 1b of the package 1 (illustrated in FIG. 2), which can itself function as heat dissipater or be coupled (in a way not illustrated herein) to an external heat dissipater so as to increase the capacity of heat dissipation towards the outside.

The package coating 5, inter alia, englobes and coats at the top the support 4 (leaving the bottom surface 4b thereof exposed, as mentioned previously), and a lateral surface 4c.

The first portion P1 of the package 1 further comprises a bottom insulation multilayer 26, arranged on top of the support 4. In particular, the bottom insulation multilayer 26 is a multilayer of the DBC (Direct Bonded Copper) type, and is hence formed by a respective top metal layer 26a and a respective bottom metal layer 26b, both made of copper, as well as by a respective intermediate layer 26c made of ceramic material, for example alumina ($Al_2O_3$), or alternatively aluminum nitride (AlN) or beryllium oxide (BeO). The top metal layer 26a, the bottom metal layer 26b, and the intermediate layer 26c are arranged stacked on one another and are coupled together by means of direct eutectic bonding at high temperature; the intermediate layer 26c electrically insulates the top and bottom metal layers 26a, 26b.

Figure 2:
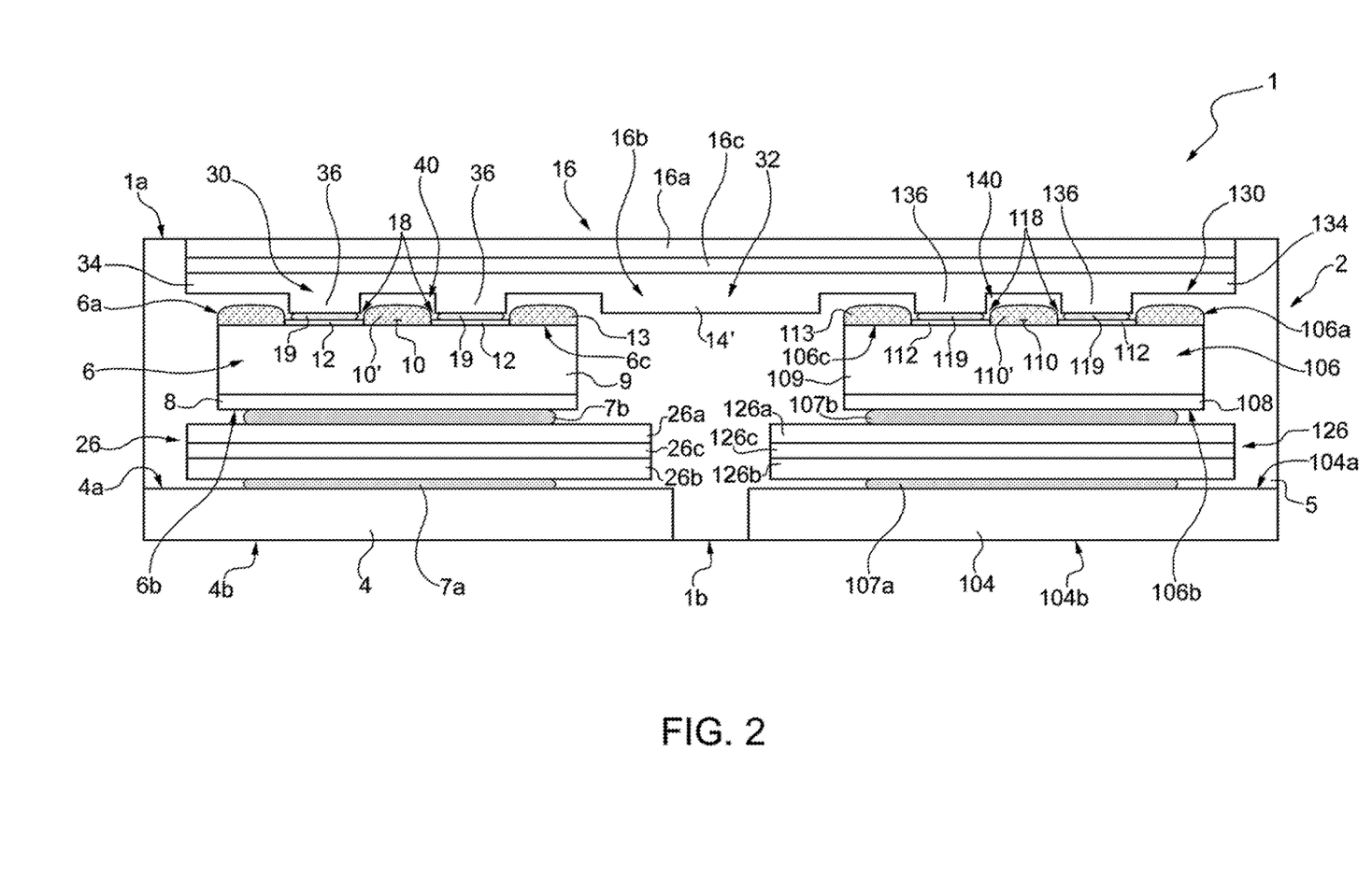
FIG. 2 is a schematic cross-sectional view of the device illustrated in FIG. 1.

The bottom metal layer 26b is coupled to the top surface 4a of the support 4, by means of a first layer of solder paste 7a (illustrated in FIG. 2).

The semiconductor device 2 further comprises a first die 6 and a second die 106, formed inside which are a first power MOSFET M1 and a second power MOSFET M2, respectively. Without this implying any loss of generality, the first and second dice 6, 106 are the same as one another and are arranged in a symmetrical way within the semiconductor device 2. In what follows, for brevity, only the first die 6 is hence described. Moreover, the components of the second die 106 are designated by the same reference numbers as the components of the first die 6, increased by 100. In addition, the first and second dice 6, 106 are, respectively, coupled to the first and second portions P1, P2 of the package 1, in one and the same way. Hence, in what follows just bonding of the first die 6 to the first portion P1 of the package 1 is described. In addition, it may be noted how in FIG. 1 the first and second dice 6, 106 are illustrated qualitatively, as likewise the corresponding details as regards coupling with an element defined hereinafter as "top insulation multilayer 16", described in what follows; for these details, as well as for the details regarding the first and second dice 6, 106, the reader is hence referred to the description of FIG. 2.

In detail, the first die 6 is arranged on the bottom insulation multilayer 26 of the first portion P1 of the package 1.

In greater detail, the first die 6 has a front surface 6a, a rear surface 6b, and an intermediate surface 6c. Moreover, the first die 6 comprises a body 9 made of semiconductor material, for example silicon, integrated in which are, in a way in itself known and not illustrated in detail herein, a plurality of elementary units (or cells) of the first power MOSFET M1, arranged in stripes and having, for example, a vertical, columnar, structure, each cell being provided with a respective gate region and a respective source region. The semiconductor body 9 is delimited at the top by the aforementioned intermediate surface 6c and that forms gate and source regions of the first power MOSFET M1.

In addition, the first die 6 comprises a drain metallization 8, which is arranged underneath the semiconductor body 9, in direct contact therewith, and forms the rear surface 6b of the first die 6. The drain metallization 8 forms a drain pad of the first power MOSFET M1. In addition, the drain metallization 8, and hence the rear surface 6b of the first die 6, is coupled to the top metal layer 26a of the bottom insulation multilayer 26 by interposition of a second layer of solder paste 7b. The drain metallization 8 is hence electrically and thermally connected to the top metal layer 26a of the insulation multilayer 26. Moreover, the drain metallization 8 of the first power MOSFET M1 is electrically insulated from the support 4.

The first die 6 further comprises a passivation region 13, which extends on the semiconductor body 9 and forms the aforementioned top surface 6a. In this connection, it should be noted how, as mentioned previously, in FIG. 1 the first die 6 is illustrated as a whole, i.e., without illustrating, inter alia, the semiconductor body 9, the passivation region 13, and the drain metallization 8.

Figure 3:
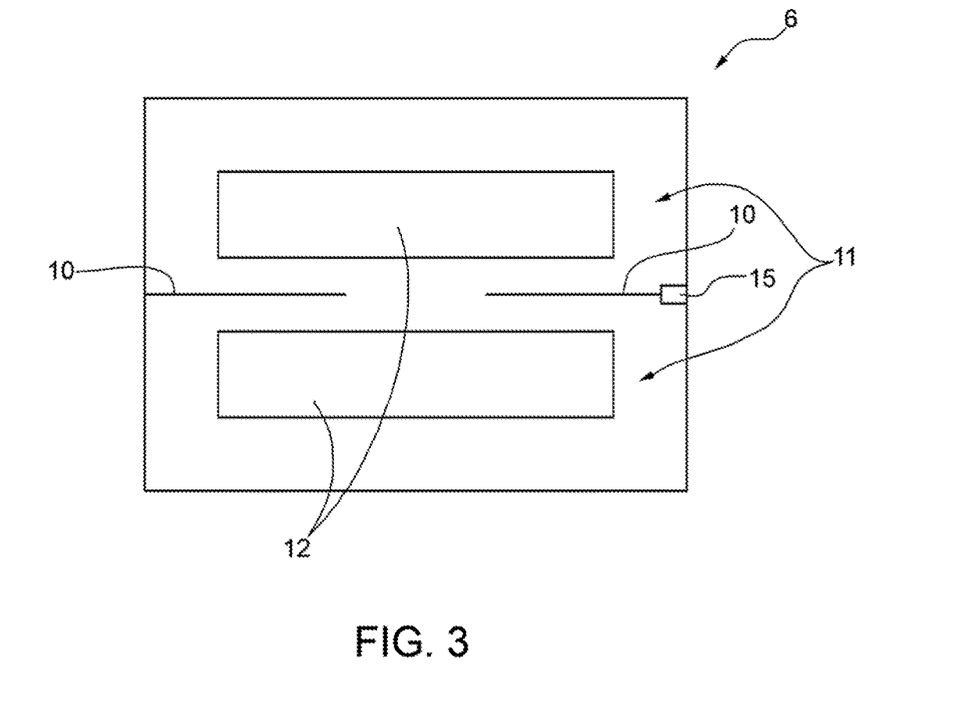
FIG. 3 is a schematic top plan view, with portions removed, of a die of the device illustrated in FIGS. 1 and 2.

As shown in greater detail in FIG. 3 (where, however, the passivation region 13 is not illustrated, for greater clarity), the first die 6 comprises a number of gate-metallization lines 10 (the so-called "gate fingers"), which enable biasing (in a way not illustrated, but in itself known) of the gate regions of the cells of the first power MOSFET M1. In this connection, in the embodiment illustrated in FIG. 3 just one gate-metallization line 10 is present, without this implying any loss of generality.

The gate-metallization lines 10 extend underneath the passivation region 13 and are parallel to one another. In addition, the gate-metallization lines 10 may be continuous or, as in the example illustrated, have interruptions along their longitudinal extension. In addition, the gate-metallization lines 10 delimit, in top plan view, portions 11 (illustrated only in FIG. 3) of the passivation region 13, which are referred to in what follows as "top passivation areas 11".

Figure 4:
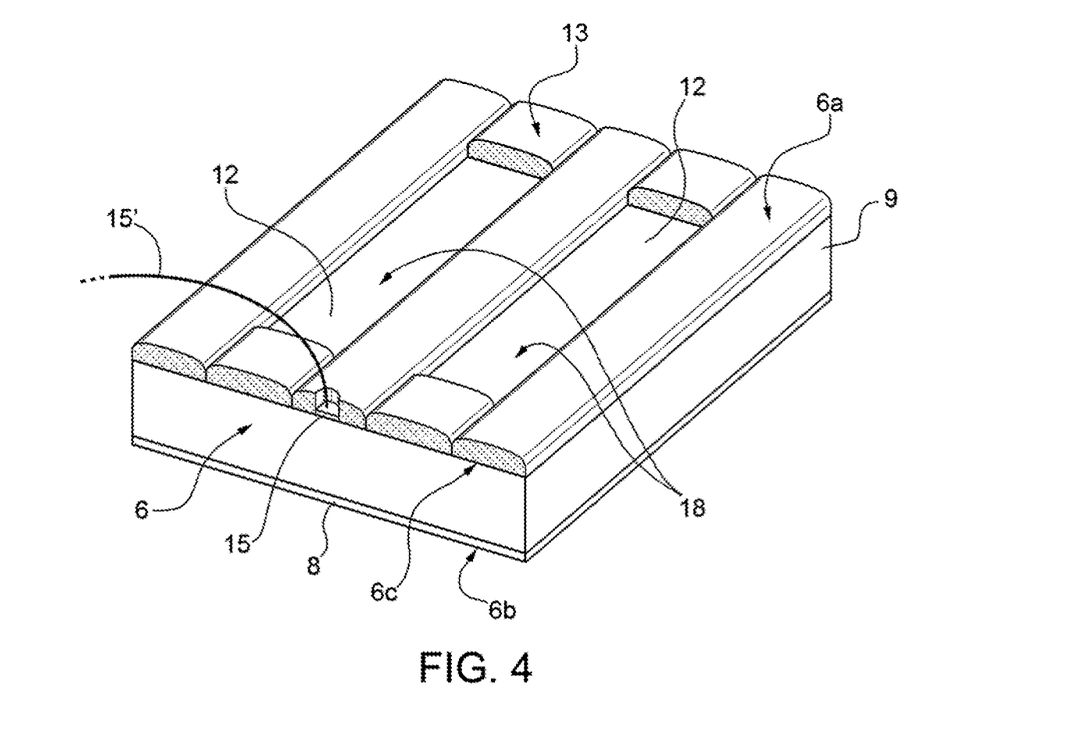
FIG. 4 is a schematic perspective view of the die illustrated in FIG. 3.

As illustrated in FIG. 4, formed within the top passivation areas 11 are corresponding windows 18 (illustrated in FIG. 4), which extend within the passivation region 13, starting from the top surface 6a, for a depth such as to not penetrate into the semiconductor body 9. In particular, each window 18 is delimited laterally by two portions of the corresponding top passivation area 11.

As may be seen in FIGS. 2-4, the first die 6 further comprises source contact regions 12 (also referred to as source pads), which are made of conductive material (for example, a metal), are in electrical contact with the source regions of the cells of the first power MOSFET M1 and are insulated from the aforesaid gate-metallization lines 10. In addition, each source contact region 12 delimits a corresponding window 18 at the bottom.

In the example illustrated, the source contact regions 12 are rectangular in top plan view and moreover have dimensions that are the same as one another. In particular, present in the first die 6 are two top passivation areas 11, present within which are two windows 18, arranged inside which are corresponding source contact regions 12. However, as mentioned previously, the distribution and number of the gate-metallization lines 10, of the top passivation areas 11, and of the source contact regions 12 may vary according to the characteristics and requirements of the power semiconductor device 2. Moreover, assuming, in general, a succession of any number of top passivation areas 11, the top initial and final passivation areas of the succession are delimited only on a respective side (in particular, the one facing the other top passivation areas) by a respective gate-metallization line 10. Consequently, considering each of the corresponding two windows 18, one of the two portions of the corresponding top passivation area 11 that delimit them (in particular, the portion facing outwards) does not contain any gate-metallization line.

As mentioned previously, the aforesaid source contact regions 12 are arranged within the top passivation areas 11, approximately at one and the same height with respect to the gate-metallization lines 10. Moreover, the source contact regions 12 delimit the corresponding windows 18 at the bottom.

Once again with reference to the gate-metallization lines 10, each of them is overlaid by a corresponding portion 10' of the passivation region 13, referred to in what follows as "corresponding main passivation portion 10'". In particular, each gate-metallization line 10 is coated with a corresponding main passivation portion 10'.

The first die 6 further comprises one or more gate pads 15, visible only in FIG. 1 (where just one is illustrated, arranged approximately, and qualitatively, on the first die 6) and in FIG. 4. In particular, with reference to FIG. 4, for simplicity of representation, this shows the gate pad 15 as being arranged in contact with the semiconductor body 9, even though in actual fact the gate pad 15 is arranged at a (short) distance from the latter. Each gate pad 15 is electrically coupled to a corresponding gate-metallization line 10. In addition, the passivation region 13 leaves the gate pads 15 exposed. Without this implying any loss of generality, in the example illustrated in FIGS. 1-4, the first die 6 comprises just one gate pad 15.

Once again with reference to the first portion P1 of the package 1, it further comprises a drain lead 27 and a gate lead 29, which have, for example, the shape of parallelepipeds, are made of the same metal material as the one of which the support 4 is made and are physically separated from one another, as well as from the support 4. The drain lead 27 is connected to the top metal layer 26a of the insulation multilayer 26, and in particular to a portion of the top metal layer 26a not overlaid by the first die 6, by means of a so-called clip 28 (illustrated in FIG. 1) made of conductive material (for example, copper), referred to in what follows as "drain clip 28". In a way in itself known, the drain clip 28 is connected at its ends to the aforementioned portion of the top metal layer 26a and to the drain lead 27, by means of corresponding areas of solder paste (not illustrated).

The gate pad 15 of the first die 6 is connected to the gate lead 29 of the first portion P1 of the package 1 by means of a conductive wire 15', i.e., by means of wire bonding.

Figure 5:
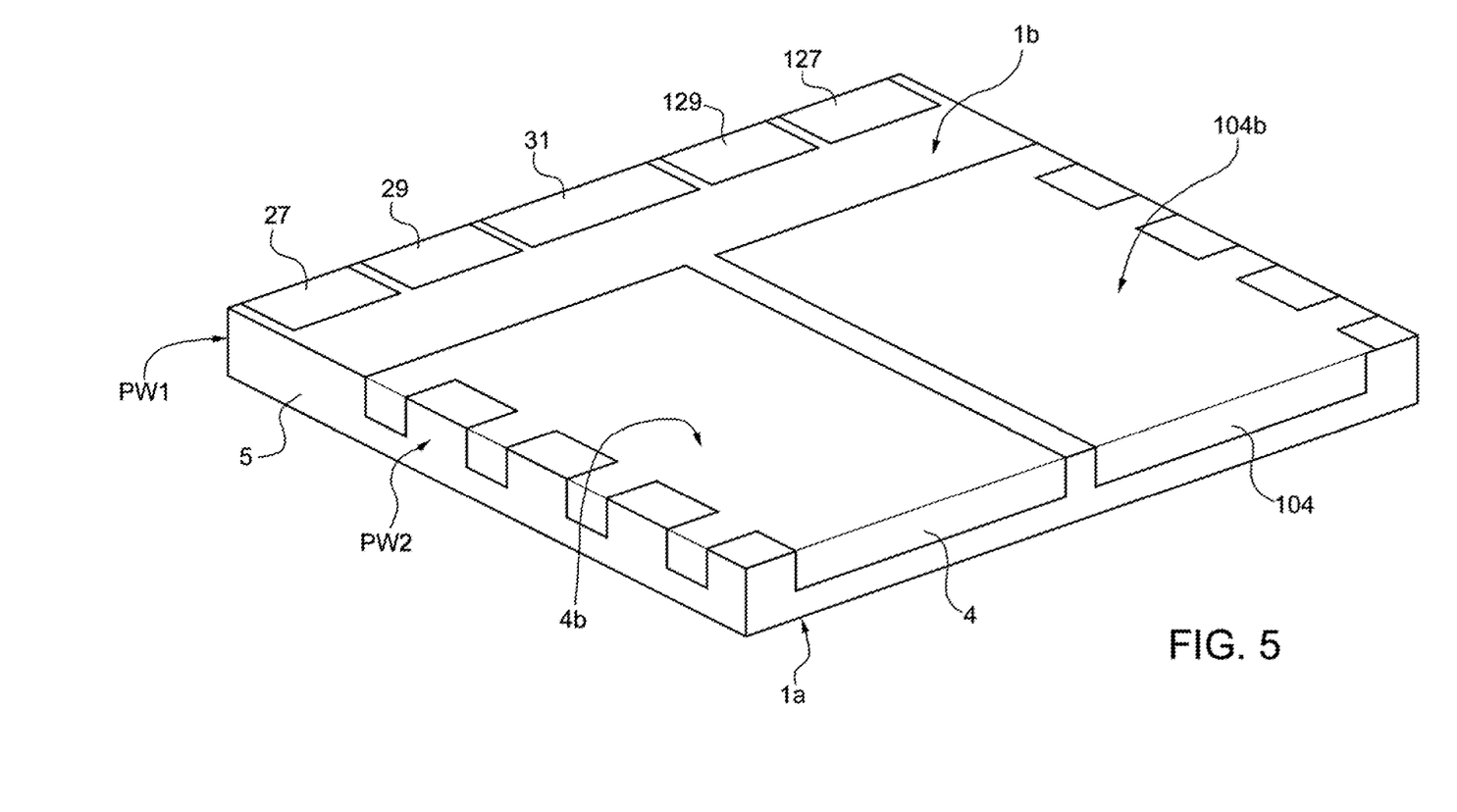
FIG. 5 is a schematic perspective view of a further embodiment of the present device.

Once again with reference to the first portion P1 of the package 1, as may be seen in FIG. 5, the corresponding drain leads 27 and gate leads 29 are exposed laterally and underneath; i.e., they are not coated with the coating 5. In other words, assuming that the coating 5 has an envelope shaped, for example, like a parallelepiped, the bottom and top bases of which are formed by the bottom surface 1b and by a top surface 1a, the drain leads 27 and gate leads 29 form a first lateral surface PW1 of said envelope, in addition to forming the bottom surface 1b. On the other hand, also the part of the support 4 is laterally exposed, since it gives out, for example, onto a second lateral surface PW2. Once again with reference to FIG. 5, it should be noted that, without this implying any loss of generality, it refers to an embodiment in which the support 4 has a shape different from a parallelepiped, since it includes a main body having a parallelepipedal shape and a plurality of protrusions, which branch off from one and the same lateral face of the main body, until they give out onto the aforementioned lateral surface PW2.

The package 1 further comprises a source lead 31, which, as described in greater detail hereinafter, is shared between the first and second portions P1, P2 of the package 1. Also the current lead 31 is exposed laterally and underneath.

The package 1 of the power semiconductor device 2 further comprises (see once again FIGS. 1 and 2) a further insulation multilayer 16, referred to in what follows as "top insulation multilayer 16".

In detail, the top insulation multilayer 16 is a DBC multilayer and includes a respective top metal layer 16a and a respective bottom metal layer 16b, both made of copper, as well as a respective intermediate insulating layer 16c made of ceramic material, for example, the same material as the one of which the intermediate insulating layer 26c is made. The thicknesses of the top metal layer 16a and of the intermediate insulating layer 16c may be equal, for example, to the thicknesses of the corresponding layers of the bottom insulation multilayer 26. The intermediate insulating layer 16c electrically insulates the top and bottom metal layers 16a, 16b.

The top metal layer 16a of the top insulation multilayer 16 forms a part of the top surface 1a of the package 1, which can function itself as heat dissipater or be coupled (in a way not illustrated herein) to a further external heat dissipater so as to increase the capacity of heat dissipation outwards.

The bottom metal layer 16b of the top insulation multilayer 16 is shaped in a way corresponding to the conformation of the first and second dice 6, 106. In particular, the bottom metal layer 16b comprises a first peripheral portion 30 and a second peripheral portion 130, and a central portion 32.

The first and second peripheral portions 30, 130 are the same as one another and couple, respectively, to the first and second dice 6, 106, in the same way. In other words, the relative arrangement of the first peripheral portion 30 and the first die 6 is the same as the relative arrangement of the second peripheral portion 130 and the second die 106. For this reason, described in what follows are only the first peripheral portion 30 and corresponding coupling thereof to the first die 6. Moreover, the elements of the second peripheral portion 130 are designated by the same reference numbers as the ones used for the first peripheral portion 30, increased by 100.

In detail, the first peripheral portion 30 of the bottom metal layer 16b has a shape that corresponds to the arrangement of the gate-metallization lines 10 of the first die 6, and more precisely to the arrangement of the corresponding main passivation portions 10', as well as to the arrangement of the source contact regions 12.

In greater detail, and with reference to FIG. 2, the first peripheral portion 30 of the bottom metal layer 16b of the top insulation multilayer 16 has a comb-like conformation. In fact, the first peripheral portion 30 includes a planar region 34 and a number of contact regions 36, which extend as bumps, starting from the planar region 34, towards the underlying first die 6. In particular, each contact region 36 extends until it penetrates into a corresponding window 18 of the underlying first die 6, so as to couple mechanically and electrically to a corresponding source contact region 12.

For instance, each contact region 36 has a parallelepipedal shape and has a respective bottom plane surface, which mechanically and electrically couples to the corresponding source contact region 12, by interposition of a corresponding solder-paste region 19. Moreover, each contact region 36 extends at a distance from the side walls of the corresponding window 18, so as not to contact the corresponding main passivation area 11.

In turn, adjacent pairs of contact regions 36 laterally delimit a corresponding insulation cavity 40, which is delimited at the top by a corresponding part of the planar region 34 and is open at the bottom. The insulation cavities 40 are hence trenches (for example, with rectangular cross section, invariant for translations parallel to the direction of extension of the gate-metallization lines 10) interposed between the contact regions 36, so as to overlie, at a distance, corresponding gate-metallization lines 10. The top wall of each trench is formed by the planar region 34, whereas the side walls are formed by the corresponding contact regions 36. Present in FIG. 2 is just one insulation cavity 40, because it is assumed, purely by way of example, that the first die 6 comprises just two source contact regions 12 and just one gate-metallization line 10. However, it is evident how the number, shape, and arrangement of the insulation cavities 40 may differ, according to the arrangement and conformation of the gate-metallization lines 10 and of the source contact regions 12.

In practice, the insulation cavities 40 are laterally staggered with respect to the windows 18, with respect to which they are moreover arranged at a greater height. In addition, the insulation cavities 40 and the windows 18 have opposite concavities; i.e., the insulation cavities 40 are open downwards, whereas the windows 18 are open upwards.

In greater detail, each insulation cavity 40 overlies a corresponding main passivation portion 10', which, as has been said, in turn overlies a corresponding gate-metallization line 10 and projects from the adjacent windows 18, towards the respective insulation cavity 40. Without this implying any loss of generality, the projection of each main passivation portion 10' is such that the point of maximum height is to a first approximation arranged above the underlying gate-metallization line 10.

In particular, each main passivation portion 10' is set at a distance from the respective insulation cavity 40; i.e., it does not contact either the top wall or the side walls of the corresponding insulation cavity 40, even though it can penetrate at least in part into the corresponding insulation cavity 40, and more precisely into the volume delimited by the latter; in other words, present between each main passivation portion 10' and the corresponding insulation cavity 40 is a gap that prevents contact between the main passivation portion 10' and the side and top walls of the insulation cavity 40. In this way, the contact regions 36 straddle or by-pass the main passivation portions 10', since they are laterally interspersed with the latter. Thus the contact regions 36, which enable contacting of the source contact regions 12, are prevented from damaging the main passivation portions 10' and the underlying gate-metallization lines 10.

As regards the central portion 32 of the bottom metal layer 16b of the top insulation multilayer 16, it connects the planar regions 34, 134 of the first and second peripheral portions 30, 130 of the bottom metal layer 16b, to form a single piece with the latter. The planar regions 34, 134 and a top portion of the central portion 32 form a layered region that may have a thickness, for example, equal to the thickness of the bottom metal layer 26b of the bottom insulation multilayer 26.

As may be seen in FIG. 1, a bottom portion of the central portion 32 of the bottom metal layer 16b moreover forms a main portion 14' of a source clip 14. This source clip 14 further comprises a connecting portion 14", which connects the aforesaid main portion 14' to the source lead 31. This connecting portion 14" may be provided integrally with the main portion 14', and hence with the central portion 32 of the bottom metal layer 16b. Variants are in any case possible, in which, for example, the source clip 14 does not form a single piece with the bottom metal layer 16b, but is coupled to the latter by interposition of a corresponding area of solder paste.

In practice, the bottom metal layer 16b of the top insulation multilayer 16 shorts the source terminals of the first and second power MOSFETs M1, M2, thus forming a node electrically accessible via the source lead 31. The drain and gate terminals of the first power MOSFET M1 are, instead, accessible via the drain lead 27 and the gate lead 29, respectively; the drain and gate terminals of the second power MOSFET M2 are instead accessible via the drain lead 127 and the gate lead 129, respectively.

The advantages of the solution disclosed emerge in clearly from what has been described above.

In particular, in terms of encumbrance, the present power device makes it possible to benefit from the advantages deriving from a package of the surface mount type, albeit guaranteeing good electrical insulation and a considerable heat-dissipation capacity.

In particular, the present package may have a maximum thickness in a vertical direction in the region of 2-3 mm. Moreover, the package affords the possibility of cooling on both sides (both top and bottom). Once again, the presence of the top insulation multilayer in bridge configuration, i.e., which extends so as to overlie both of the dice, guarantees a considerable thermal efficiency, reduced parasitic packaging electrical effects (in particular, inductive effects) and a low contact resistance. Once again, the connections to the source regions of the power MOSFETs do not require the use of wire bonding.

In particular, as regards thermal dissipation, the fact that the top metal layer 16a is insulated from the source regions of the first and second power MOSFETs M1 and M2 means that it can be sized freely so as to optimize the power dissipation, without constraints due to the need to guarantee a certain flow of current. In this connection, the thickness of the bottom metal layer 16b can be sized so that the flow of current is limited not by this, but rather by the drain clips 28 and 128.

In addition, with reference, for example, to the first portion P1 of the package 1, the presence of the top metal layer 26a of the bottom insulation multilayer 26 makes it possible to have an optimal coupling area for the drain clip 28. Moreover, the fact that the leadframe supports are insulated from the drain regions of the first and second power MOSFETs M1 and M2 means that they are at one and the same potential. Consequently, the leadframe supports can be arranged very close to one another, with consequent reduction of the vertical encumbrance of the package 1.

Finally, it is clear that modifications and variations may be made to what has been described and illustrated herein, without thereby departing from the sphere of protection of the present disclosure, as defined in the annexed claims.

The metal layers of the insulation multilayer may be made of metal materials other than copper.

The clip connections may be replaced by corresponding wire bonds, even though the clips guarantee a greater drawing-off of heat and the capacity of being traversed by higher currents.

The shape of the support of the leadframe may be different from what has been described; for example, it may include a pair of planar subregions connected together and vertically staggered with respect to one another.

The gate, source, and drain leads, as well as the portions of the support that gives out on the outside of the package may protrude with respect to the envelope of the package, instead of being flush with the respective walls of the package.

As regards each of the first and second peripheral portions of the bottom metal layer of the top insulation multilayer, the corresponding contact regions may be distributed in a way different from what has been described. In addition, each one of the aforementioned first and second peripheral portions may include a respective planar subportion, without contact regions.

Figure 6:
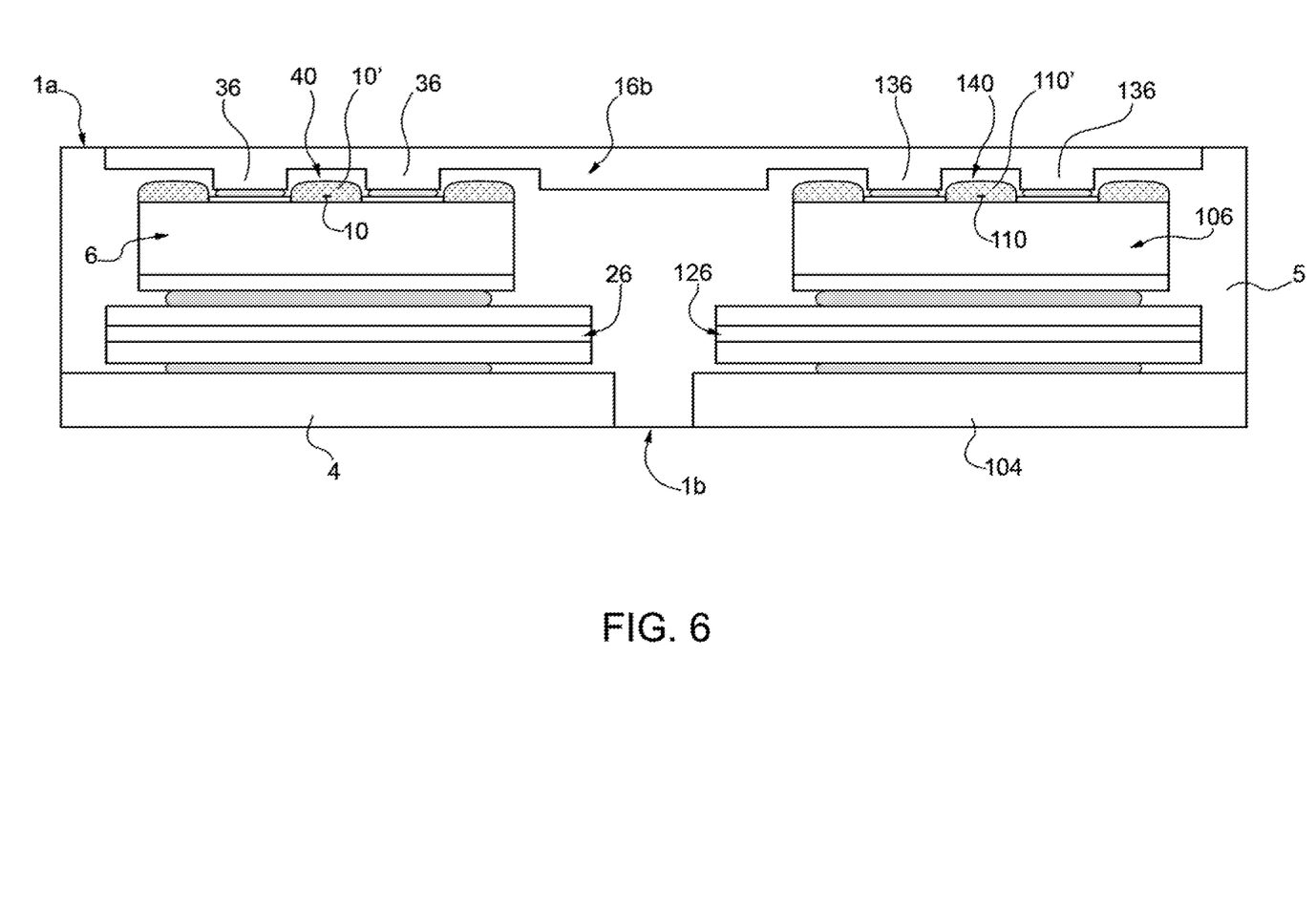
FIG. 6 is a schematic cross-sectional view of a further embodiment of the present device.

Moreover possible are embodiments of the type illustrated in FIG. 6, in which the top metal layer 16a and the intermediate layer 16c of the top insulation multilayer 16 are absent. In this case, the bottom metal layer 16b forms part of the top surface 1a of the package 1.

Finally, corresponding semiconductor devices other than MOSFETs, such as, purely by way of example, IGBTs, may be integrated in the dice. The present package makes it, in fact, possible to manage the coupling between the top insulation multilayer and any semiconductor device, present in which are passivation regions overlying metallization lines arranged on the semiconductor body of the corresponding die and interposed between contact regions that are to be biased.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A power semiconductor device, comprising:
a package of the surface mount type housing a first die and a second die, each of the first die and the second die include a plurality of conductive contact regions and a passivation region which includes a number of projecting dielectric regions and a number of windows, adjacent windows being separated by one of the projecting dielectric regions, each conductive contact region being arranged within one of the windows, the package includes:
  a first insulation multilayer and a second insulation multilayer, the first insulation multilayer carries the first die and the second insulation multilayer carries the second die, each of the first insulation multilayer and the second insulation multilayer including a first metal layer, a second metal layer and an intermediate insulating layer interposed between the first metal layer and the second metal layer; and
  a covering metal layer being on first surfaces of the first die and the second die, the covering metal layer including projecting metal regions extending into the windows, the projecting metal regions being electrically coupled to the conductive contact regions of the first die and the second die, the covering metal layer having a number of cavities interposed between the projecting metal regions, each one of the projecting dielectric regions extends into a corresponding one of the number of cavities.

2. The power semiconductor device according to claim 1, further comprising a third insulation multilayer including a third metal layer, the covering metal layer, and an intermediate insulating layer interposed between the third metal layer and the covering metal layer.

3. The power semiconductor device according to claim 2, further comprising a first support and a second support made of metal material, the first support and second support carrying, respectively, the first and second insulation multilayers.

4. The power semiconductor device according to claim 3, wherein the package further comprises:
  a package coating which covers the first die and second die and the first and second insulation multilayers; and
  a first lead which includes a part left exposed from the package coating; and
  wherein the covering metal layer is electrically coupled to the first lead.

5. The power semiconductor device according to claim 4, wherein the package coating covers the first and second supports, and wherein each of the first and second supports includes a respective portion left exposed from the package coating.

6. The power semiconductor device according to claim 5, wherein the package further comprises a second lead and a third lead, each second and third lead including a respective portion left exposed from the package coating, and wherein the first metal layers of the first and second insulation multilayers are electrically coupled, respectively, to the second and third leads.

7. The power semiconductor device according to claim 1, wherein each of the first die and second die comprises a number of metallization lines, each metallization line coated with a corresponding projecting dielectric region.

8. The power semiconductor device according to claim 7, wherein the first die and the second die include, respectively, a first transistor and a second transistor; and wherein the metallization lines of the first die and second die are gate lines of the respective transistors; and wherein the conductive contact regions of the first die and second die are source contact regions of the respective transistors.

9. The power semiconductor device according to claim 1, wherein each one of the first die and the second die comprises contact metallization; and wherein the contact metallizations of the first die and the second die are electrically coupled to the first metal layers of the first and second insulation multilayers.

10. The power semiconductor device according to claim 1, wherein the covering-metal layer extends at a distance from the passivation regions of the first and second dice.

11. A power semiconductor device comprising:
a package containing a first die and a second die, each of the first die and second die include a first surface, a second surface opposite to the first surface, a plurality of conductive contact regions on the first surface, and a passivation region on the first surface, the passivation region includes a number of projecting dielectric regions and a number of windows defined between adjacent projecting dielectric regions, each of the plurality of conductive contact regions arranged within and protruding into a corresponding one of the number of windows, the package including:
- a first insulation multilayer and a second insulation multilayer, the second surface of the first die positioned on the first insulation multilayer, the second die positioned on the second insulation multilayer, each of the first and second insulation multilayers including a first metal layer, a second metal layer and an intermediate insulating layer between the first metal layer and the second metal layer; and
- a covering metal layer on the first surfaces of the first die and second die, the covering metal layer including projecting metal regions extending into the number of windows, the projecting metal regions electrically coupled to respective ones of the plurality of conductive contact regions, the covering metal layer further including a number of cavities interposed between the projecting metal regions, each of the number of cavities positioned to overlie one of the number of projecting dielectric regions, each of the number of projecting dielectric regions extending into each of the number of cavities.

12. The power semiconductor device according to claim 11, wherein the package comprises a surface mount package.

13. The power semiconductor device according to claim 11 further comprising an insulation multilayer over the first surfaces of first die and second die, the insulation multilayer including a third metal layer, the covering metal layer, and an intermediate insulating layer interposed between the third metal layer and the covering metal layer.

14. The power semiconductor device according to claim 13 further comprising a first metal support and a second metal support, the first and second insulation multilayers being positioned on the first and second metal supports, respectively.

15. The power semiconductor device according to claim 14, wherein the package further comprises:
- a package coating covering the first die and second die and the first and second insulation multilayers; and
- a first lead electrically coupled to the covering metal layer, the first lead including a portion exposed from the package coating.

16. The power semiconductor device according to claim 15, wherein the package coating further covers the first and second metal supports, and wherein each of the first and second metal supports includes a portion exposed from the package coating.

17. A package, comprising:
- a first insulation multilayer and a second insulation multilayer configured to carry a first die and a second die, respectively, each of the first and the second insulation multilayers including a first metal layer, a second metal layer and an intermediate insulating layer positioned between the first metal layer and second metal layer; and
- a covering metal layer arranged on first surfaces of the first die and second die, the covering metal layer including projecting metal regions configured to extend into windows in first and second passivation regions on the first die and second die, respectively, the first and second passivation regions including a plurality of projecting dielectric regions and the covering metal layer configured to electrically contact conductive contact regions exposed on the first die and second die within the windows, the covering metal layer further including a plurality of cavities positioned between the projecting metal regions, each of the plurality of cavities positioned over a corresponding one of the plurality of projecting dielectric regions, each of the plurality of projecting dielectric regions extending into each of the plurality of cavities.

18. The package of claim 17, wherein the package comprise a surface mount type of package.

19. The package of claim 17, where each of the first die and second die includes a power MOSFET device.

20. The package of claim 19 further comprising a first conductive support and a second conductive support configured to support the first and second insulation multilayers, respectively.

21. The package of claim 17, wherein the covering metal layer includes a first portion covering the first die, a second portion covering the second die, and a third portion extending from the first portion to the second portion, the third portion including a source clip extending away from the covering metal layer.

* * * * *